(12) United States Patent
Knott et al.

(10) Patent No.: US 9,114,480 B2
(45) Date of Patent: Aug. 25, 2015

(54) METHODS FOR JOINING A MONOCRYSTALLINE PART TO A POLYCRYSTALLINE PART BY MEANS OF AN ADAPTER PIECE MADE OF POLYCRYSTALLINE MATERIAL

(75) Inventors: Ulrich Knott, München (DE); Erwin Bayer, Dachau (DE); Thomas Uihlein, Dachau (DE)

(73) Assignee: MTU AERO ENGINES GMBH, Munich (DE)

( * ) Notice: Subject to any disclaimer, the term of this patent is extended or adjusted under 35 U.S.C. 154(b) by 539 days.

(21) Appl. No.: 13/056,022

(22) PCT Filed: Aug. 6, 2009

(86) PCT No.: PCT/DE2009/001132
§ 371 (c)(1),
(2), (4) Date: Jan. 26, 2011

(87) PCT Pub. No.: WO2010/020216
PCT Pub. Date: Feb. 25, 2010

(65) Prior Publication Data
US 2011/0129353 A1 Jun. 2, 2011

(30) Foreign Application Priority Data
Aug. 21, 2008 (DE) .......................... 10 2008 039 113

(51) Int. Cl.
| | |
|---|---|
| *B23K 20/12* | (2006.01) |
| *F01D 5/30* | (2006.01) |
| *B23K 1/00* | (2006.01) |
| *B23K 13/01* | (2006.01) |
| *B23K 20/16* | (2006.01) |
| *B23K 20/22* | (2006.01) |
| *C30B 29/52* | (2006.01) |
| *C30B 33/06* | (2006.01) |
| *F01D 5/34* | (2006.01) |

(52) U.S. Cl.
CPC ............... *B23K 20/12* (2013.01); *B23K 1/0018* (2013.01); *B23K 13/01* (2013.01); *B23K 20/1205* (2013.01); *B23K 20/129* (2013.01); *B23K 20/1215* (2013.01); *B23K 20/16* (2013.01); *B23K 20/22* (2013.01); *C30B 29/52* (2013.01); *C30B 33/06* (2013.01); *F01D 5/3061* (2013.01); *F01D 5/34* (2013.01); *B23K 2201/001* (2013.01); *F05B 2230/239* (2013.01); *F05D 2300/607* (2013.01)

(58) Field of Classification Search
CPC .......... F01D 5/063; F01D 5/3061; F01D 5/34
USPC ....... 416/213 R, 229 R; 228/112.1, 113, 114; 29/889, 889.1, 889.2
See application file for complete search history.

(56) References Cited

U.S. PATENT DOCUMENTS

| | | | | |
|---|---|---|---|---|
| 3,768,147 | A * | 10/1973 | Berry et al. ................. | 228/112.1 |
| 4,475,980 | A | 10/1984 | Rhemer et al. | |
| 5,106,266 | A * | 4/1992 | Borns et al. ................ | 416/241 R |
| 5,292,385 | A * | 3/1994 | Kington ........................ | 148/404 |
| 5,318,406 | A * | 6/1994 | Bardes ......................... | 416/223 A |
| 5,511,949 | A * | 4/1996 | Thore .......................... | 416/213 R |
| 6,331,217 | B1 * | 12/2001 | Burke et al. ................... | 148/522 |
| 2005/0084381 | A1 | 4/2005 | Groh et al. | |
| 2006/0067832 | A1 * | 3/2006 | Groh et al. ................. | 416/244 A |
| 2008/0107531 | A1 * | 5/2008 | Chou et al. ................ | 416/213 R |

FOREIGN PATENT DOCUMENTS

| | | |
|---|---|---|
| DE | 102006041324 A1 | 3/2008 |
| EP | 1642667 A1 | 4/2006 |

* cited by examiner

*Primary Examiner* — Nathaniel Wiehe
*Assistant Examiner* — Michael Sehn
(74) *Attorney, Agent, or Firm* — Barlow, Josephs & Holmes, Ltd.

(57) ABSTRACT

The present invention relates to methods for joining a rotationally asymmetrical part, preferably a turbine blade, which is made of a monocrystalline material, to a part, preferably a rotor core, which is made of polycrystalline material, having the method steps of: —joining the rotationally asymmetrical part to an adapter piece made of polycrystalline material by means of rotational friction welding, and —joining the adapter piece to the part made of polycrystalline material. The present invention also relates to a turbine blisk having a rotor core made of polycrystalline material and turbine blades made of monocrystalline material.

7 Claims, No Drawings

METHODS FOR JOINING A MONOCRYSTALLINE PART TO A POLYCRYSTALLINE PART BY MEANS OF AN ADAPTER PIECE MADE OF POLYCRYSTALLINE MATERIAL

The present invention relates to a method for joining a monocrystalline, rotationally asymmetrical part to a polycrystalline part, preferably in order to produce a blisk ("Blade Integrated Disk" or "Blade Integrated Rotor"; a rotor, in which the blades are formed in one piece with the rotor disk, for example, by welding or machining). The present invention, in addition, relates to a turbine blisk according to the preamble of claim 8.

Different manufacturing methods are known for the production of a blisk for turbines or compressors. Thus, a blisk can be produced from a disk, the outer contour of which is subjected to machining in order to form the blade profile radially at the outer periphery of the disk. In another manufacturing method, blade parts are produced separately and joined by linear friction welding to the outer periphery of the rotor disk. In this method, the blade is moved in an oscillating manner relative to the fixed rotor disk, while it is pressed against the rotor disk. As a consequence, heat of friction arises in the region of the joint surfaces, which leads to the circumstance that the material is heated in the region of the joint surfaces up to the soft plasticizable state, in which a plastic flow of the material is possible. The welded joint is formed between the parts by a concluding upsetting process, in which the parts are pressed together at high pressure.

In order to increase the durability of turbine or compressor blades, blades made of monocrystalline material are used increasingly, since these have almost no grain boundaries or other structural defects. Problems arise, however, when monocrystalline blades are joined to a polycrystalline rotor disk by means of the above-described friction welding process. Thus, depending on the crystallographic orientation of the monocrystalline material in each case, an additional load is necessary in order to bring the monocrystalline material into the plasticizable state. With reference to the above-described friction welding process, this means that the welding behavior of the monocrystalline material changes as a function of the crystallographic orientation of the monocrystalline material with respect to the oscillation and pressure directions. In the most unfavorable case, the load necessary for friction welding based on the crystallographic orientation of the monocrystalline material can be so high that the machine tool or the tool head is damaged.

In order to solve this problem, WO 2007/144557 A1 provides a method, in which, prior to a linear friction welding, a monocrystalline component is oriented in such a way that a primary slip plane of the monocrystal is aligned relative to a plane that contains both the oscillation direction as well as the pressure direction, and that a primary slip direction of the monocrystal extends within a specific angular range relative to the oscillation direction.

The method proposed in WO 2007/144557 A1 is, in fact, ideal for directly welding turbine blades to a rotor disk, but there results a limited field of application, since material adaptations cannot be realized and orientations of the monocrystalline part must be taken care of in a complex manner. In addition, the method is expensive and limited to lengthwise geometries.

Thus, it is the object of the invention to provide a simple and cost-effective method for joining a monocrystalline part, preferably a turbine blade, to a polycrystalline part, preferably a rotor disk, as well as a turbine blisk that can be produced in a cost-effective manner.

The object of the invention is achieved by means of a method having the features of claim 1 as well as a turbine blisk having the features of claim 8.

Advantageous enhancements of the invention are the subject of the subclaims.

The method according to the invention for joining a rotationally asymmetrical part, which is preferably a turbine blade, which is made of a monocrystalline material, to a part, which is preferably a rotor core or a rotor disk, which is made of polycrystalline material, has the method steps of
  joining the rotationally asymmetrical part to an adapter piece made of polycrystalline material by rotational friction welding, and
  subsequent joining of the adapter piece to the part made of polycrystalline material.

An essential aspect of the method according to the invention consists of the fact that first the monocrystalline part is welded to the polycrystalline adapter piece by rotational friction welding. Rotational friction welding, in comparison to linear friction welding, offers the advantage that the influence of the crystallographic orientation of the monocrystalline material on welding behavior is essentially smaller. Consequently, in the method according to the invention, a complicated alignment of the monocrystalline material relative to the load direction is dispensed with. Due to the use of rotational friction welding, there are almost no inclusions or other defects in the weld plane and a crack-free joining with a very constricted zone of heat influence is achieved, which does not affect the monocrystalline structure. In addition, the method according to the invention is a cost-effective as well as reliable method, dependent on both the method and the equipment.

The joining method according to the invention will now be explained in more detail on the basis of a preferred example of embodiment.

In the preferred example of embodiment, the method according to the invention is used for the production of a turbine blisk, which comprises a plurality of turbine blades that are welded to the outer periphery of a rotor disk or a rotor core.

In the first method step, a turbine blade, which is rotationally asymmetrical and comprises a monocrystalline material (rotationally asymmetrical part made of monocrystalline material), is welded to an adapter piece by means of rotational friction welding. The adapter piece comprises a polycrystalline material and is preferably rotationally symmetrical. Advantageously, the adapter piece has a cylindrical shape. Prior to welding, the turbine blade is placed in a mold by means of which it can be held/fixed during the welding process. In this way, the turbine blade can be cast, for example (pouring/casting the monocrystalline blade with a plastic compound, for example), whereby the casting material is again removed in a later method step, or the turbine blade can be clamped in a special cartridge.

After the turbine blade is fixed in place, it is welded to the adapter piece. The welding method that is used is preferably rotational friction welding. For this purpose, the adapter piece is preferably clamped in such a way that it can be rotated. While the adapter piece is rotated, the turbine blade and the adapter piece are pressed against one another. Stated more precisely, a foot of the turbine blade and a surface, preferably the front surface, of the adapter piece are pressed against each other. Frictional heat, which heats the material in this region up to a state in which plastic flow is possible, arises at these so-called joint surfaces. Then the driving of the adapter piece is stopped and, by means of a concluding upsetting process in which the two parts are pressed against each other at a defined pressure required for upsetting, the turbine blade and the adapter piece are welded to one another, whereby a fine-grain, high-strength material structure is formed in the region of the interfaces. Due to material displacement, a welding bead forms in a ring around the welding zone during the upsetting process. This welding bead is later removed by a suitable processing procedure, such as milling, for example.

In the following method step, the polycrystalline adapter piece plus welded turbine blade are joined to a polycrystalline support for the turbine blade (part made of polycrystalline material). The support for the turbine blade or the rotor core is preferably a disk, which is preferably forged. The adapter piece is joined to the rotor core with the use of known joining methods, such as, for example, linear friction welding, inductive welding, combined soldering, diffusion soldering, etc. The above-described procedures are repeated for a plurality of turbine blades until the turbine blisk is completed.

In addition to the above-described method steps, the method according to the invention may additionally comprise the step of fine working/finishing of the turbine blade. This step can be inserted at any place in the method. It preferably takes place after the turbine blade is welded to the adapter piece.

Although the preferred embodiment has been described with reference to the production of a turbine blisk, the method can also be used for the production of a compressor blisk, for example, or other products in which a monocrystalline part is to be joined to a polycrystalline part.

The invention claimed is:

1. A method for the individual joining of an individual rotationally asymmetrical turbine blade, which is made of a monocrystalline material, to a rotor core, which is made of a polycrystalline material, having the method steps of:
    joining the rotationally asymmetrical turbine blade to a respective polycrystalline adapter piece made entirely of a polycrystalline material by rotational friction welding at a joint so that the polycrystalline material of the respective polycrystalline adapter piece is in direct contact with the monocrystalline material of the turbine blade, and
    wherein the respective adapter piece is cylindrical, and is rotationally symmetrical;
    wherein the rotationally asymmetrical turbine blade has a foot; and
    wherein the rotationally asymmetrical turbine blade is joined at its foot to the respective adapter piece, and the foot is pressed against a front surface of the respective adapter piece;
    whereby a planar welding zone is located at the joint between the foot of the turbine blade and the front surface of the respective adapter piece, and a welding bead forms in a ring around the planar welding zone; and
    joining the respective adapter piece to the rotor core made of polycrystalline material.

2. The method according to claim 1, further comprising the step of:
    taking up the rotationally asymmetrical turbine blade in a mold.

3. The method according to claim 2, wherein uptake in the mold comprises casting as well as clamping the rotationally asymmetrical turbine blade in a cartridge.

4. The method according to claim 1, further comprising the step of:
    removing the welding bead which has formed between the rotationally asymmetrical turbine blade and the respective adapter piece by means of rotational friction welding.

5. A turbine blisk with a rotor core made of polycrystalline material and turbine blades made of monocrystalline material, comprising:
    a polycrystalline adapter piece made entirely of a polycrystalline material, which is disposed between each turbine blade and the rotor core, and which is in direct contact with the turbine blade,
    wherein the adapter piece is cylindrical and is rotationally symmetrical;
    wherein the turbine blade has a foot;
    wherein the adapter piece has a front surface;
    wherein the turbine blade is joined at its foot to the front surface of the adapter piece; and
    wherein a planar welding zone is located at a joint between the foot of the turbine blade and the front surface of the adapter piece, the planar welding zone being bounded by an outer edge in the form of a ring.

6. The turbine blisk according to claim 5, wherein the adapter piece is welded to the turbine blade and is joined to the rotor core.

7. The turbine blisk according to claim 6, wherein the adapter piece is welded to the turbine blade by means of rotational friction welding.

* * * * *